US009519011B2

(12) United States Patent
Kunze et al.

(10) Patent No.: US 9,519,011 B2
(45) Date of Patent: Dec. 13, 2016

(54) ADAPTER FOR A SENSOR FOR MEASURING A DIFFERENTIAL SIGNAL

(75) Inventors: Alexander Kunze, Munich (DE); Stefan Ketzer, Geiersthal (DE); Martin Peschke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/377,877

(22) PCT Filed: Apr. 17, 2012

(86) PCT No.: PCT/EP2012/056987
§ 371 (c)(1),
(2), (4) Date: Oct. 9, 2014

(87) PCT Pub. No.: WO2013/124002
PCT Pub. Date: Aug. 29, 2013

(65) Prior Publication Data
US 2015/0369841 A1 Dec. 24, 2015

(30) Foreign Application Priority Data

Feb. 24, 2012 (DE) .................. 10 2012 202 844
Apr. 2, 2012 (DE) .................. 10 2012 205 352

(51) Int. Cl.
*G01R 31/02* (2006.01)
*G01V 3/00* (2006.01)
(Continued)

(52) U.S. Cl.
CPC ....... *G01R 1/06788* (2013.01); *G01R 1/06738* (2013.01); *G01R 1/073* (2013.01); *G01R 1/07307* (2013.01); *G01R 1/06766* (2013.01)

(58) Field of Classification Search
CPC . G01R 1/06788; G01R 1/07307; G01R 1/073; G01R 1/06738; G01R 1/06766
(Continued)

(56) References Cited

U.S. PATENT DOCUMENTS 5,461,797 A * 10/1995 Royer .................. G01B 5/202
33/501.14
6,404,215 B1 * 6/2002 Nightingale ....... G01R 1/07364
324/72.5
(Continued)

FOREIGN PATENT DOCUMENTS

DE      202010009370 U1    9/2010
EP           1726965 A1    11/2006

OTHER PUBLICATIONS

"International Preliminary Report on Patentability (translation)", International Application No. PCT/EP20121056987, Sep. 4, 2014.
(Continued)

Primary Examiner — Farhana Hoque
(74) Attorney, Agent, or Firm — Potomac Technology Law, LLC

(57) ABSTRACT

An adapter for a sensor measuring a differential signal comprises two electrically conductive test-contact elements which are arranged in each case eccentrically relative to an axis of rotation in order to register respectively one partial signal of the differential signal. Moreover, two adjustment components, each rotatable about one of the two axes of rotation, are provided in the adapter for the adjustment of a variable spacing distance between the two test-contact elements. The two adjustment components are connected to one another in a force-fit manner.

16 Claims, 3 Drawing Sheets

(51) Int. Cl.
*G01R 1/067* (2006.01)
*G01R 1/073* (2006.01)

(58) Field of Classification Search
USPC .................................. 324/72.5, 750.16, 754
See application file for complete search history.

(56) References Cited

U.S. PATENT DOCUMENTS

| | | | |
|---|---|---|---|
| 7,102,370 B2* | 9/2006 | Cannon | G01R 1/06788 324/754.02 |
| 2003/0193341 A1 | 10/2003 | McTigue | |
| 2007/0229099 A1* | 10/2007 | Campbell | G01R 1/06755 324/755.01 |
| 2009/0212938 A1* | 8/2009 | Swaim | G01R 1/06788 340/539.1 |

OTHER PUBLICATIONS

Germany PTO, "Examination Report", DE102012205352.2, Apr. 26, 2016.

* cited by examiner

ADAPTER FOR A SENSOR FOR MEASURING A DIFFERENTIAL SIGNAL

CROSS-REFERENCE TO RELATED APPLICATION(S)

The present application is a national phase application of PCT application No. PCT/EP2012/056987 (filed Apr. 17, 2012), and claims priority to German Patent Application Nos. DE 10201202844.7 (filed Feb. 24, 2012) and DE 102012205352.2 (filed Apr. 2, 2012), the entireties of which are incorporated herein by reference.

FIELD

The invention relates to an adapter for a sensor for measuring a differential signal.

BACKGROUND

Measuring a differential signal with the use of an oscilloscope is a familiar task in development laboratories and test stations. In order to register the two partial signals of the differential signal, a sensor with two test-contact probes is used, which each register one partial signal and route it to the oscilloscope for further signal processing and display on a screen.

Since the two test-contact points, at which the two partial signals of the differential signal are registered with the sensor, provide a certain spacing distance on the printed circuit board which can differentiate between the individual measurements of different differential signals on a printed circuit board, a sensor is required, with which the spacing distance between the two test-contact probes can be matched to the different spacing distance between two test-contact points.

A sensor of this kind, of which the test-contact probes can be adjusted to different spacing distances from one another, is known from U.S. Pat. No. 7,102,370 B1. For this purpose, the sensor in the embodiment illustrated in FIG. 6 provides two rotary elements capable of being rotated relative to one another, which are each connected to a test-contact probe arranged eccentrically with reference to its axis of rotation.

With a technical embodiment of this kind of a sensor, a slip can occur under some circumstances at the contact points between the two rotary elements rotatable relative to one another. When the user of the sensor wishes to adjust the spacing distance between the two test-contact probes, this slip disadvantageously leads to a non-simultaneous rotation of the rotary elements about their own axes of rotation and accordingly determines a non-symmetrical position change of the two test-contact elements. Moreover, as a result of the slip, it cannot be guaranteed with a sensor of this kind, that the two test-contact elements will necessarily remain at the spacing distance set by the user.

What is needed, therefore, is a sensor for measuring a differential signal, which, on the one hand, guarantees a simultaneous, symmetrical position adjustment of the two test-contact elements as required by the user and, on the other hand, guarantees that the two test contact elements remain at the spacing distance set by the user.

SUMMARY

Embodiments of the present invention advantageously address the foregoing requirements and needs, as well as others, by providing for a sensor for measuring a differential signal, which, on the one hand, guarantees a simultaneous, symmetrical position adjustment of the two test-contact elements and, on the other hand, guarantees that the two test contact elements remain at the spacing distance.

According to example embodiments of the present invention, an adapter comprises two electrically conductive test-contact elements, which are arranged eccentrically in each case relative to an axis of rotation and which each register a partial signal of the differential signal, and two adjustment components each rotatable about one of the two axes of rotation in order to adjust a variable spacing distance between the two test-contact elements, which are arranged according to the invention in a force-fit connection with one another.

As a result of the eccentricity of each test-contact element relative to an axis of rotation and as a result of the rotatability of each adjustment component relative to one of the two axes of rotation, it is possible to adjust any required spacing distance between the two test-contact elements in an infinite manner within a given adjustment range, which is specified by twice the length of the eccentricity. By way of example, the adjustment of the variable spacing distance between the two test-contact elements is implemented by adjustment components, which are electrically insulating and which can therefore be touched during the measurement of the differential signal by the fingers of the person using the sensor and are therefore embodied to be adjustable.

According to further example embodiments, two adjustment components are connected to one another according to the invention in a force-fit manner. By way of example, the two adjustment components are simultaneously rotatable, and both test-contact elements are therefore always advantageously changed in their position in a symmetrical manner. By way of further example, the force-fit connection between the two adjustment components allows a self-limiting of the adapter, as a result of which, after adjustment by the user, the two test-contact elements remain at a constant spacing distance relative to one another.

In a first embodiment of the invention, the force-fit connection between the two adjustment components is implemented by external teeth provided on a substantially rotationally symmetrical element of the two adjustment components, which are arranged in an interlocking engagement with one another. In a second embodiment of the invention, the force-fit connection is realized by frictional forces, which act between two running surfaces embodied on a substantially rotationally symmetrical element of the two adjustment components, which can be coated or provided with elastic strips, such as rubber bands.

According to further example embodiments, an electrically conductive shaft rotatable about the axis of rotation of the adjustment component is connected in a rotatable manner to a connection of a sensor base-element, and a test-contact element and an electrically conductive connecting part for the eccentric connection between a shaft and a test-contact element are integrated in each adjustment component. In this manner, on the one hand, an electrical connection is realized between a test-contact element and a connection of the sensor base-element and, on the other hand, a rotatable adjustment of the test-contact element about an axis of rotation extending through the connection of the sensor base-element is realized.

By way of example, realizing the eccentricity via a connecting part allows the use of a standard component which, in combination with a shaft, manufactured respectively as a single component, and a test-contact element, can be manufactured more cost-favorably as a multi-part solution than a shaft realized as a single-part solution with an eccentric test-contact element.

By way of further example, the two connecting parts, and therefore the two adjustment components, may be orientated relative to one another in such a manner that the test-contact elements are arranged symmetrically for every adjusted spacing distance relative to a plane, which is disposed in the middle of the two shafts at right angles relative to a connecting straight-line between the two shafts.

According to further example embodiments, the two test-contact elements can preferably be embodied either as a test-contact probe or as a test-contact socket.

According to further example embodiments, in order to compensate irregularities between the two test-contact points at which the two partial signals of the differential signal are registered, the test-contact elements may be mounted in a spring-loaded manner in the axial direction.

According to one embodiment, the rotatable connection respectively between a shaft and an associated connection of the sensor base-element is implemented through a recess, which is provided at the end of the shaft facing towards the sensor base-element and into which an electrically conductive pin integrated in a connection of the sensor base-element is inserted. The end of the shaft facing towards the sensor base-element is embodied in a conical manner and preferably provides at least one slot tapering in the direction towards the end of the shaft. The pin integrated in a connection of the sensor base-element preferably provides a pointed end. In this manner, the sensor with its two shafts can be brought into contact with the two pins integrated in the connections of the sensor base-element and released again comparatively readily. Accordingly, this connection guarantees a comparatively firm seating during the implementation of the individual measurements.

According to a further embodiment, the adjustment by the user of the variable spacing distance between the two test-contact elements can be implemented in an ergonomic manner by a knob-like widening on the adjustment component directed radially outwards.

According to a further embodiment, the electrically insulating embodiment of the two adjustment components can be realized in a cost-favorable manner by using in each case a synthetic-material part manufactured by injection-molding technology. In order to distinguish between the test-contact elements each measuring one partial signal of the differential signal with regard to a correct connection with a connection of the sensor base-element providing a given polarity, the associated adjustment components may each be a different color.

BRIEF DESCRIPTION OF THE DRAWINGS

Various example embodiments of the invention, providing an adapter for a sensor measuring a differential signal, are explained in detail below with reference to the drawings, wherein like components are labeled with the same reference numbers, and in which.

DETAILED DESCRIPTION

Various approaches for a sensor for measuring a differential signal, which, on the one hand, guarantees a simultaneous, symmetrical position adjustment of the two test-contact elements and, on the other hand, guarantees that the two test contact elements remain at the spacing distance, are described. In the following description, for the purposes of explanation, numerous specific details are set forth in order to provide a thorough understanding of the invention. It is apparent, however, that embodiments of the invention may be practiced without these specific details or with an equivalent arrangement. In other instances, well known structures and devices are shown in block diagram form in order to avoid unnecessarily obscuring the invention.

Figure 1:
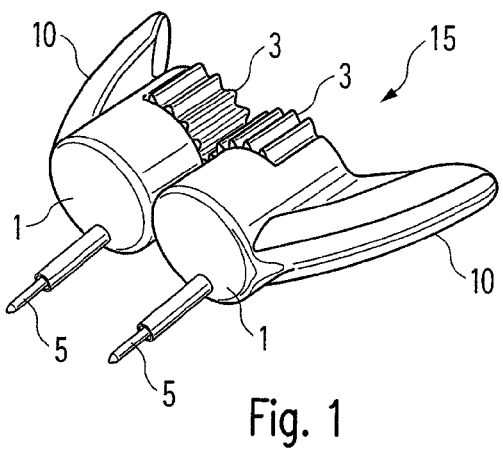
FIG. 1 illustrates a perspective view of a first embodiment of an adapter with test-contact probes, according to example embodiments of the invention.
Figure 2:
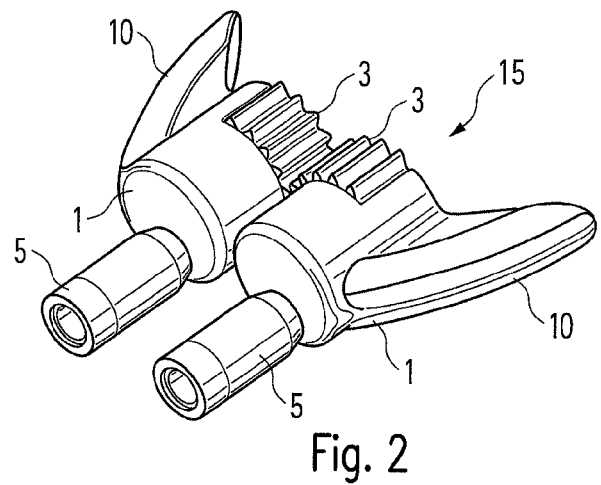
FIG. 2 illustrates a perspective view of a second embodiment of an adapter with test-contact sockets according to example embodiments of the invention.
Figure 3:
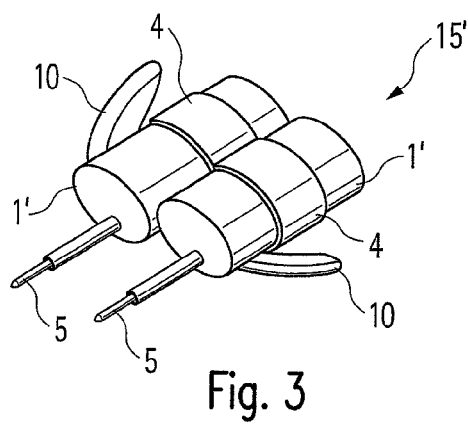
FIG. 3 illustrates a perspective view of a third embodiment of an adapter with test-contact probes according to example embodiments of the invention.

FIG. 1 illustrates a perspective view of a first embodiment of an adapter with test-contact probes, according to example embodiments of the invention. FIG. 2 illustrates a perspective view of a second embodiment of an adapter with test-contact sockets according to example embodiments of the invention. FIG. 3 illustrates a perspective view of a third embodiment of an adapter with test-contact probes according to example embodiments of the invention.

With reference to FIGS. 1 and 2, an adapter according to example embodiments of the invention in the first and second embodiments, element 15 as shown respectively in FIG. 1 and FIG. 2, each comprises the two adjustment components 1, and, in the third embodiment, element 15' as shown in FIG. 3, comprises the two adjustment components 1', which are each manufactured from a synthetic material using injection-molding technology. In order to distinguish in which connection 8 of the sensor base-element 9 shown in FIG. 6A and with which polarity the respective adjustment component 1 or respectively 1' is plugged with one partial signal of the differential signal registered via its associated test-contact element 5, the two adjustment components 1 and respectively 1' contained in an adapter 15, 15' according example embodiments of the invention may each be a different color.

In a first embodiment of the invention according to FIG. 1, the two adjustment components 1 are arranged in a force-fit connection with one another, in each case via external teeth 3, which are provided in a given partial angular segment of the cylindrical surface of the substantially rotationally symmetrical body of the two adjustment components 1 and which engage with one another in a geared manner. The same applies for the second embodiment of FIG. 2. While spring-loaded probes are provided as the test-contact elements 5 in FIG. 1, these are test sockets in FIG. 2.

In a third embodiment of the invention according to FIG. 3, the two adjustment components 1' are arranged in a force-fit connection with one another via the frictional forces which act, for example, between the two rubber bands 4, which are stretched respectively over the cylindrical running surface of the substantially rotationally symmetrical body of the two adjustment components 1'. Instead of rubber bands, a different coating made from rubber or another high-friction material could also be applied to the running surfaces.

Figure 4:
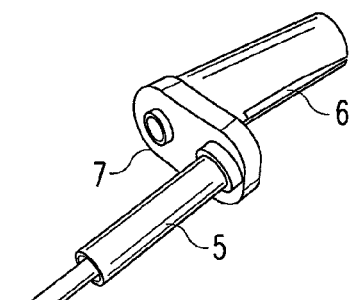
FIG. 4 illustrates a perspective view of test-contact probes of an adapter according to example embodiments of the invention arranged eccentrically relative to a shaft corresponding to the first embodiment of FIG. 1.

A test-contact element 5, a shaft 6 and a connecting part 7, which connects the test-contact element 5 eccentrically to the shaft 6 mounted in a rotatable manner, are integrated in each adjustment component 1 or respectively 1', according to FIG. 4 respectively. While the connecting part 7 is preferably completely concealed within each adjustment component 1 or respectively 1', the test-contact element 5 projects outwards at an end surface of the substantially rotationally symmetrical body of each adjustment component 1 or respectively 1', in order to register a partial signal of the differential signal with the end of the test-contact element 5 projecting significantly from each adjustment component 1 or respectively 1' at a test-contact point, for example, on the printed circuit board. The shaft 6 of each adjustment component 1 or respectively 1' is also guided outwards from each adjustment component 1 or respectively 1' at the respectively other end surface of each adjustment component 1 or respectively 1', in order to establish an electrical and mechanical contact with the connection 8 of the sensor base-element 9.

Figure 7:
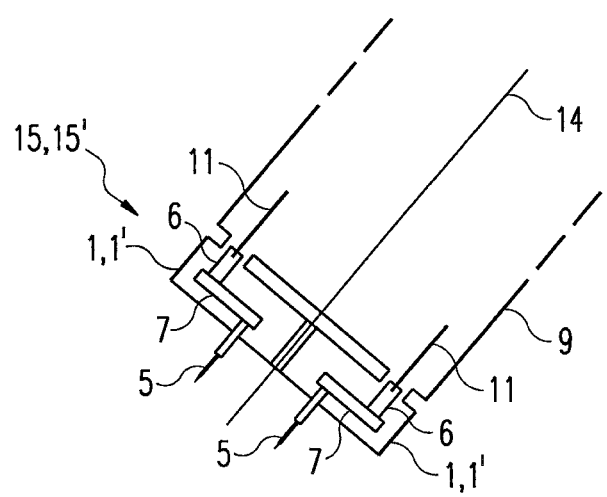
FIG. 7 illustrates a plan view of the symmetry between the two test-contact elements of the adapter according to example embodiments of the invention.

The two adjustment components 1 or respectively 1' of the adapter according to example embodiments of the invention are orientated with reference to one another, in each case for every adjusted spacing distance between the two test-contact elements 5, in such a manner that the two test-contact elements 5 are arranged symmetrically to a plane 14, as shown in FIG. 7, which is disposed centrally between the two shafts 8 and at right angles to the connecting straight-line between the two shafts 8. In order to realize this symmetrical orientation of the two test-contact elements 5, the connecting parts 7 integrated respectively in the two adjustment components 1 or respectively 1' are also arranged symmetrically relative to this plane.

To adjust the orientation of the two adjustment components 1 or respectively 1' relative to one another, and accordingly to adjust the spacing distance between the two test-contact elements 5, which each project from one of the two adjustment components 1 or respectively 1', each adjustment component 1 or respectively 1' provides respectively on the cylindrical surface a knob-like widening 10 directed radially outwards. However, it is also possible that the widening 10 is present only on one of the two adjustment components 1 or respectively 1'.

The test-contact elements 5 can be embodied as test-contact probes, as illustrated in FIGS. 1, 3, 4, 6A, in order to contact test-contact points on the printed circuit board, which are characterized by a very small geometric dimension (for example, very narrow conductor strips) or which are surrounded by components projecting very far above the printed circuit board. However, as an alternative, as illustrated in FIG. 2, the test-contact elements 5 can be embodied as test-contact sockets, in order to contact test-contact points on posts, pins or wired components or in order to contact a plug contact with two contact pins which are arranged at a given spacing distance from one another.

According to example embodiments, the test-contact elements 5 may be mounted in a spring-loaded manner, as indicated in FIGS. 1, 3, 4, 6A and 6B by the stepped and two-part embodiment of the test-contact elements 5. In this manner, irregularities between the two test-contact points, which can be registered with the two test-contact elements 5 of the sensor 9, can be bridged.

Figure 5:
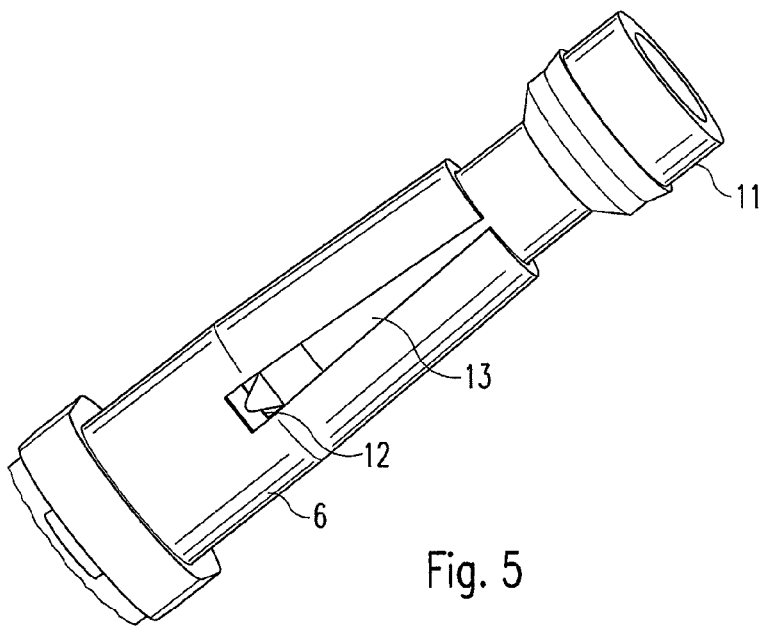
FIG. 5 illustrates a perspective view of a rotatable connection between a shaft associated with an adapter and a pin associated with a connection of a sensor base-element according to example embodiments of the invention.

According to FIG. 5, the rotatable connection respectively between a shaft 6 of the adapter according to example embodiments of the invention and a pin 11 associated with a connection 8 of the sensor base-element 9 comprises a recess 12, which is provided at an end of each shaft 6 facing towards the sensor base-element 9, and the pin 11 of a connection 8 of the sensor base-element 9 inserted into this recess 12 and mounted in a rotatable manner. The shaft 6 provides at least one slot 13, preferably two slots 13 in the region of the recess 12. Each of these slots 13 tapers in the direction towards the end of the shaft 6 facing the sensor base-element 13.

If no pin 11 is inserted into the recess 12, the slot 13 closes at the end of the shaft 6 facing the sensor base-element 13, while, in the case of a pin 11 inserted into the recess 12, the slot 13 opens at the end of the shaft 6 facing the sensor base-element 13. Accordingly, the compressive force, which guarantees a secure seating of the pin 11 in the recess 12 of the shaft 6 is exerted by the side walls of the recess 12 of the shaft 6 on the inserted pin 11. The pin 11 provides a pointed end, so that combining the two shafts 6 of the adapter according to example embodiments of the invention with the two connections 8 of the sensor base-element 9 is readily possible. The compressive force which is exerted by the side walls of the recess 12 of the shaft 6 onto the pin inserted into the recess 12, is dimensioned in such a manner that, in addition to a secure seating of the pin 11 in the recess 12, a release of the pin 11 from the recess 12 of the shaft 6 is also readily possible.

Figures 6A, 6B:
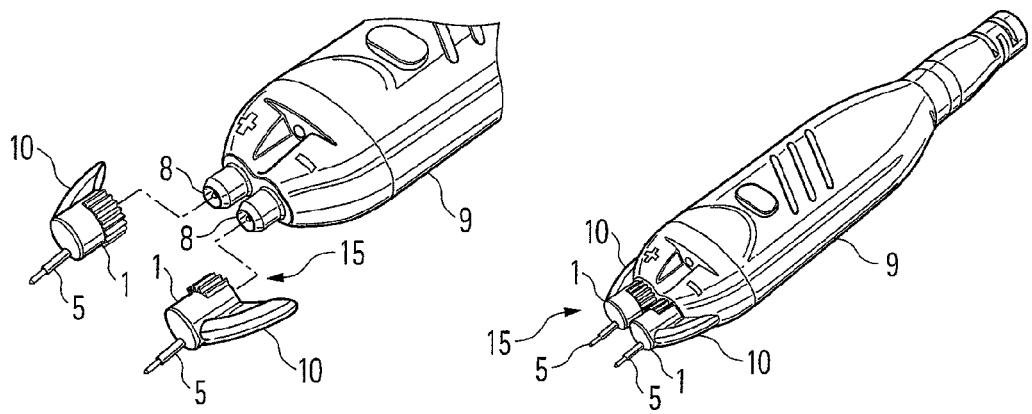
FIG. 6A illustrates a perspective overview of an adapter detached from a sensor base-element.
FIG. 6B illustrates a perspective overview of an adapter plugged into a sensor base-element.

The pin 11 associated with a connection 8 is arranged concentrically in the center of a substantially sleeve-like connection 8, as shown in FIG. 6A. In order to introduce the pin 11 of a connection 8 of the sensor base-element 9 into the recess 12 of the shaft 6 of the adapter according to example embodiments of the invention integrated in an adjustment component 1 or respectively 2, in the region of the shaft 6, a sleeve-like recess corresponding to the sleeve-like connection 8 can be provided in each adjustment component 1 or respectively 1'.

To minimize wear on the rotatable bearing of the pin 11 associated with the connection 8 of the sensor base-element 9 in the recess 12 of the shaft 6 integrated in an adjustment component 1 or respectively 1' of the adapter 15, 15' according to example embodiments of the invention, the hard-gilded pin 11 and the soft-gilded shaft 6 are preferably additionally hardened with copper-beryllium. As a result of the softer gilding, the majority of wear takes place not on the pin 11 but rather on the shaft 6.

According to further embodiments, the adapter may be designed in such a manner that minimizes any influence of the adapter on the two partial signals of the differential signal to be measured. In order to minimize any attenuation of the two partial signals in the adapter, the signal paths of the two partial signals within the adapter 15, 15' according to example embodiments of the invention are minimized by minimizing the geometric lengths of the portion of the test-contact element 5 disposed in the respective adjustment component 1 or respectively 1', of the connecting part 7 and of the shaft 6. In order to minimize any charging up of the adapter by charges of the partial signals to be registered, the input capacitances are kept minimal by minimizing the cross-sections of the test-contact elements 5, the connecting parts 7 and the shafts 6 of the adapter 15, 15' according to example embodiments of the invention.

In the illustrated embodiments of the adapter 15, 15', a bandwidth preferably larger than 5 GHz is realized. The maximum bandwidth within the transmission behavior of the adapter 15, 15' according to example embodiments of the invention may be realized through simplification of the geometric embodiment of the test-contact elements 5 integrated in the two adjustment components 1 or respectively 1', of the connecting parts 7, of the shafts 6 and of the rotatable mounting of the pins 11 associated with the sensor base-element 9 in the recesses 12 of the shafts 6.

According to further embodiments, an improved common-mode suppression between the two partial signals of the differential signal under test is achieved through a symmetrical adjustment of both of the test-contact elements 5 relative to a plane 14, which is arranged in the center and at right angles to a spacing straight-line between the two rotatably mounted shafts 8—and therefore symmetrically relative to the two pins 11 of the two connections 8 of the sensor base-element 9.

The invention is not restricted to the embodiments presented. In particular, all combinations of any of the features claimed in the claims, of the features disclosed in the description and the features illustrated in the drawings are also covered by the invention.

The invention claimed is:

1. An adapter comprising:
   two adjustment components, each configured to be positioned in a rotatable manner about an axis of rotation relative to a respective connector element of a sensor device base-element; and
   two electrically conductive test-contact elements, each situated on a respective one of the adjustment components in a fixed manner with respect to the respective adjustment component and in a defined eccentric manner relative to the axis of rotation of the respective adjustment component, wherein the test-contact elements are configured in order to register a partial signal of a differential signal being measured; and
   wherein the two adjustment components are arranged in a force-fit connection with one another in a manner whereby, when positioned on the respective connector elements of the sensor device base-element, rotation of an adjustment component about its respective axis of rotation adjusts a variable spacing distance between the two test-contact elements, while maintaining a symmetrical orientation between the two test-contact elements.

2. The adapter according to claim 1, wherein each of the adjustment components includes a substantially rotationally symmetrical base-element with external teeth arranged in engagement with one another, wherein the force-fit connection between the two adjustment components is realized by the engagement of the external teeth.

3. The adapter according to claim 1, wherein each adjustment component includes a substantially rotationally symmetrical base-element with a running surface embodied on a cylindrical surface of the adjustment component, wherein the force-fit connection between the two adjustment components is realized by frictional forces occurring between the running surfaces rolling against one another.

4. The adapter according to claim 1, wherein each adjustment component includes an electrically conductive shaft rotatable about the axis of rotation of the adjustment component, wherein the adjustment component is connected in a rotatable manner to the respective connector element of the sensor device base-element.

5. The adapter according to claim 4, wherein each adjustment component further includes an electrically conductive connecting part configured for an eccentric connection of the test-contact element to the respective shaft.

6. The adapter according to claim 1, wherein the adjustment components are electrically insulating.

7. The adapter according to claim 1, wherein, with respect to the variable spacing distance between the two test-contact elements, the connecting parts are orientated relative to one another in such a manner that the associated test-contact elements are symmetrically arranged relative to a plane disposed centrally between the two shafts and at right angles to a connecting straight-line between the two shafts.

8. The adapter according to claim 1, wherein each test-contact element is a test probe.

9. The adapter according to claim 8, wherein each test probe is mounted in a spring-loaded manner in an axial direction.

10. The adapter according to claim 1, wherein each test-contact element is a test socket.

11. The adapter according to claim 1, wherein each shaft, at its end facing towards the sensor device base-element, includes an end with a recess, in which an electrically conductive pin is mounted in a rotatable manner in a respective connection element of the sensor device base-element.

12. The adapter according to claim 11, wherein the end of each shaft facing towards the sensor device base-element is shaped in a conical manner and in each case provides at least one slot tapering in a direction towards the end of the shaft.

13. The adapter according to claim 11 wherein each pin includes a pointed end for improved insertion into the recess at the end of the associated shaft.

14. The adapter according to claim 1, wherein at least one of the two adjustment components includes a knob-like, radially orientated widening for the adjustment of the variable spacing distance between the two test-contact elements.

15. The adapter according to claim 1, wherein the two adjustment components are manufactured from a synthetic material using injection molding technology.

16. The adapter according to claim 1, wherein the two adjustment components are each embodied in a different color.

* * * * *